United States Patent
Ding et al.

(10) Patent No.: US 6,800,213 B2
(45) Date of Patent: Oct. 5, 2004

(54) PRECISION DIELECTRIC ETCH USING HEXAFLUOROBUTADIENE

(76) Inventors: Ji Ding, 38730 Lexington St., #181, Fremont, CA (US) 94536; Hidehiro Kojiri, 2-3-14, Misato-dai, #103, Narita, Chiba (JP); Yoshio Ishikawa, 3-5-11 Kouzu-no-mori, Narita, Chiba (JP); Keiji Horioka, Building 16-604, 2-9, Utase, Mihama-ku, Chiba (JP); Ruiping Wang, 622 Sammie Ave., Fremont, CA (US) 94539; Robert W. Wu, 3112 Paseo Granda, Pleasanton, CA (US) 95466; Hoiman (Raymond) Hung, 1282 Burkette Dr., San Jose, CA (US) 95129

( * ) Notice: Subject to any disclaimer, the term of this patent is extended or adjusted under 35 U.S.C. 154(b) by 230 days.

(21) Appl. No.: 10/165,249

(22) Filed: Jun. 7, 2002

(65) Prior Publication Data

US 2003/0036287 A1 Feb. 20, 2003

Related U.S. Application Data

(62) Division of application No. 09/506,112, filed on Feb. 17, 2000, now Pat. No. 6,432,318.

(51) Int. Cl.[7] .......................................... H01L 21/3065
(52) U.S. Cl. ........................... 216/67; 216/72; 216/74; 216/79; 438/710; 438/714; 438/723; 438/743
(58) Field of Search ..................... 216/67, 72, 74, 216/79; 438/710, 714, 723, 743; 252/79.1

(56) References Cited

U.S. PATENT DOCUMENTS

| | | | |
|---|---|---|---|
| 4,581,101 A | 4/1986 | Senoue et al. | 156/643 |
| 5,338,399 A | 8/1994 | Yanagida | 156/662 |
| 5,770,098 A | 6/1998 | Araki et al. | 216/67 |
| 6,069,092 A | 5/2000 | Imai et al. | 438/723 |
| 6,136,643 A | 10/2000 | Jeng et al. | 438/253 |
| 6,159,862 A | 12/2000 | Yamada et al. | 438/712 |
| 6,174,451 B1 * | 1/2001 | Hung et al. | 216/67 |
| 6,184,107 B1 | 2/2001 | Divakaruni et al. | 438/427 |
| 6,225,184 B1 | 5/2001 | Hayashi et al. | 438/396 |
| 6,228,775 B1 | 5/2001 | Coburn et al. | 438/714 |
| 6,232,209 B1 | 5/2001 | Fujiwara et al. | 438/585 |
| 6,287,905 B2 | 9/2001 | Kim et al. | 438/197 |
| 6,297,163 B1 | 10/2001 | Zhu et al. | 438/707 |
| 6,362,109 B1 * | 3/2002 | Kim et al. | 438/706 |
| 6,387,287 B1 * | 5/2002 | Hung et al. | 216/67 |
| 6,432,318 B1 * | 8/2002 | Ding et al. | 216/67 |
| 6,602,434 B1 * | 8/2003 | Hung et al. | 216/39 |
| 6,613,689 B2 * | 9/2003 | Liu et al. | 438/712 |
| 6,613,691 B1 * | 9/2003 | Hung et al. | 438/723 |

FOREIGN PATENT DOCUMENTS

| | | |
|---|---|---|
| JP | 57-155732 | 9/1982 |
| JP | 11-186229 | 7/1999 |
| WO | WO 99/34419 | 8/1999 |

* cited by examiner

*Primary Examiner*—Allan Olsen
(74) *Attorney, Agent, or Firm*—Charles S. Guenzer; Joseph Bach

(57) ABSTRACT

An oxide etching recipe including a heavy hydrogen-free fluorocarbon having F/C ratios less than 2, preferably $C_4F_6$, an oxygen-containing gas such as $O_2$ or CO, a lighter fluorocarbon or hydrofluorocarbon, and a noble diluent gas such as Ar or Xe. The amounts of the first three gases are chosen such that the ratio (F—H)/(C—O) is at least 1.5 and no more than 2. Alternatively, the gas mixture may include the heavy fluorocarbon, carbon tetrafluoride, and the diluent with the ratio of the first two chosen such the ratio F/C is between 1.5 and 2.

22 Claims, 3 Drawing Sheets

PRECISION DIELECTRIC ETCH USING HEXAFLUOROBUTADIENE

RELATED APPLICATION

This application is a division of Ser. No. 09/506,112, filed Feb. 17, 2000, now issued as U.S. Pat. No. 6,432,318.

FIELD OF THE INVENTION

The invention relates generally to plasma etching of materials. In particular, the invention relates to etching dielectric layers in semiconductor integrated circuits.

BACKGROUND ART

The continuing commercialization of ever more complex semiconductor integrated circuits has required further developments in the fabrication processes used in making them. One of the most demanding areas involves the etching of holes into dielectric layers. The problems arise from the need to etch very narrow but deep holes into the dielectric materials. Although the most common dielectrics are silicon dioxide and related silicate materials used as inter-level dielectric layers to electrically isolate multiple layers of wiring from each other, dielectrics are commonly used for other purposes.

One such other application is the use of undoped spin-on glass (USG) as a hard mask in etching a very deep trench into polysilicon for the formation of trench capacitors for dynamic random addressable memory (DRAM). As illustrated in the sectioned isometric view of FIG. 1, a substrate includes a relatively thick layer 10 of polysilicon. A trench capacitor is to be formed in the polysilicon layer 10 using the polysilicon as one electrode. A thin stop layer 12 of silicon nitride overlies the polysilicon layer 10, and a hard mask layer 14 of undoped spin-on glass (USG) overlies the stop layer 12. USG is a silicate glass that is spun onto the wafer and dried, just as is spin-on glass (SOG) and in particular borophosphosilicate glass (BPSG), commonly used as an inter-level dielectric. However, BPSG is heavily doped while USG is undoped silicate glass. A photoresist layer 16 is spun onto the top of the USG layer 14, hardened, and photographically patterned to have a mask aperture 18 in the lateral form of the desired trench.

This structure is then subjected to a multi-step etching process that, as illustrated in the partially sectioned isometric view of FIG. 2, first etches through the USG layer 14 and the nitride stop layer 12 and then into the polysilicon layer 10 to produce a deep narrow trench 20 in the polysilicon layer 10. The trench may be 30 $\mu$m deep. Trench widths are decreasing to about 0.3 $\mu$m or less. Because of its extreme depth relative to the photoresist thickness, the USG layer 14 is used as a hard mask to mask the polysilicon etching after the photoresist has been consumed. The polysilicon etch is chosen to be selective to USG. A USG thickness of 1.2 $\mu$m is typical for a trench hard mask, a thickness approximately equal to typical inter-level dielectric thicknesses so that the etching processes developed here for the trench hard mask are applicable to via holes through a inter-level dielectric as well as to other applications. The nitride layer 12 is used both as an etch stop for the oxide etching and as an anti-reflective coating in optically imaging the narrow trench into the photoresist layer 16. The etching process thus requires three separate etching substeps, usually using three different etching gases in one plasma etching chamber: a mask open step for etching the trench shape into the USG oxide layer 14; a nitride open for removing the nitride stop layer 12 at the bottom of the oxide trench; and the polysilicon etch.

After the trench 20 has been formed in the polysilicon 10, a thin conformal dielectric layer is deposited over the sides and bottom of the trench, and then a metal is filled into the remaining volume of the trench. A large-area trench capacitor is formed across the thin dielectric layer separating the polysilicon and the metal in the trench, the two electrodes of the capacitor.

This invention is primarily directed to etching of an oxide, which in the specifically described embodiment is the mask open step, which has strong similarities to etching via and contact holes through inter-level oxides for inter-level wiring. The etch must be relatively deep and create a narrow, vertical hole while stopping on a non-oxide layer. Such oxide etching is typically performed in a plasma etch reactor using a fluorocarbon etching gas and an argon diluent with strong substrate biasing to accelerate argon ions to the wafer in a process referred to as reactive ion etching (RIE). The fluorocarbon deposits a polymer on the oxide sidewalls and bottom of the developing oxide hole. The energetic argon ions activate a reaction at the hole bottom that differentiates underlying oxide and non-oxide. The effect is that the bottom oxide is etched, but the non-oxide is not. Fluorocarbon-based oxide etching can achieve very high selectivity to underlying nitride.

The conventional fluorine-based oxide etching, however, presents increasing problems as the hole widths are being further reduced. Excessive polymerization in the oxide hole being etched will cause the polymer to bridge the hole and to prevent any further etching, an effect called etch stop. Obviously, etch stop must be avoided.

Another requirement is that during the oxide etching some photoresist must remain. Otherwise, the top of the USG layer will also be etched. Because of the geometry, exposed corners of the photoresist are most prone to etching, resulting in the formation of facets at the lip of the photoresist aperture. If the photoresist facets reach the underlying oxide, the mask aperture starts to widen, and the critical dimension (CD) is lost. The photoresist thickness cannot be freely increased because a thicker photoresist degrades the photographic resolution in patterning the photoresist. As a result, high photoresist selectivity, particularly at the facets, is also required during the oxide etch.

Yet another problem arising in oxide etching of narrow features is that striations are often observed to occur on the oxide sidewalls. The striations are vertically extending irregularities that result in a rough sidewall. Since the oxide layer is being used as a hard mask in the polysilicon etching, such irregularities are transferred to the underlying polysilicon. Striations in the polysilicon make it difficult to fill metal into the trench and also introduce reliability and performance problems with the irregularly shaped capacitors. It is now generally believed that the oxide striations somehow originate in the sidewalls of the photographically patterned hole in the photoresist and propagate downwardly into the oxide sidewalls.

For these reasons, it is desirable to develop an oxide etching process that is selective to photoresist, does not produce etch stop, and reduces the occurrence of striations.

There has been much recent development in the use of more complex fluorocarbons in etching high aspect-ratio holes in oxide. Octafluorocyclobutane ($C_4F_8$) has been favored for several years in advanced applications, but its process window between etch stop and unacceptably low selectivity is now considered to be too narrow. Wang et al. have suggested several 3-carbon fluorocarbons in U.S. patent application Ser. No. 09/259,536, flied Mar. 1, 1999, now issued as U.S. Pat. No. 6,174,451. Hung et al. have demonstrated superior performance with hexafluorobutadiene ($C_4F_6$) in U.S. patent application Ser. No. 09/440,810, filed Nov. 15, 1999, now issued as U.S. Pat. No. 6,602,434. Others have promoted the use of octafluoropentadiene ($C_5F_8$). At least the Wang and Hung work have further emphasized a large fraction of argon or xenon diluent. The better ones of these fluorocarbons have been characterized as being free of hydrogen and having a ratio of fluorine to carbon atoms (F/C) of less than 2.

However, it is not clear that using only the heavier hydrogen-free fluorocarbons will be sufficient for even more advanced applications. Etch stop continues to be problem if the chemistry is too polymerizing. Photoresist selectivity is becoming an increasingly difficult problem as its thickness decreases with decreasing feature sizes. The sensitivity to striations with less conventional fluorocarbons has not been well explored. It is now generally accepted that the addition of oxygen, particularly in the form of carbon monoxide (CO), will reduce etch stop without too great a decrease in selectivity. Fluorocarbons with high F/C ratios are strong etchers but provide poor selectivity. The use of polymerizing hydrofluoromethanes, particularly difluoromethane ($CH_2F_2$), will aid selectivity but at the risk of etch stop.

Heretofore, finding an oxide etch recipe satisfying the various requirements over a reasonable process window entailed a hit or miss methodology of trying many combinations of gases with many ratios of their components. It is greatly desired that the methodology be systematized to at least reduce the number of possibilities.

SUMMARY OF THE INVENTION

An oxide etching process in which a plasma of an etching gas is applied to the oxide layer through a photoresist mask to etch a hole into the oxide. The etching gas contains active components and a diluent gas such as argon. The active components include a hydrogen-free fluorocarbon having an F/C ratio of less than 2, preferably $C_4F_6$ or $C_5F_8$, and a hydrofluorocarbon or hydrogen-free fluorocarbon with an F/C ratio greater than 2. Carbon tetrafluoride ($CF_4$) provides improved control. The active components optionally include CO or $O_2$. The relative flows of the active components are chosen such that the ratio (F—H)/(C—O) is between 1.5 and 2, where F, H, C, and O are the total atomic concentrations of fluorine, hydrogen, carbon, and oxygen atoms respectively in the etching gas.

DETAILED DESCRIPTION OF THE PREFERRED EMBODIMENTS

Figure 1:
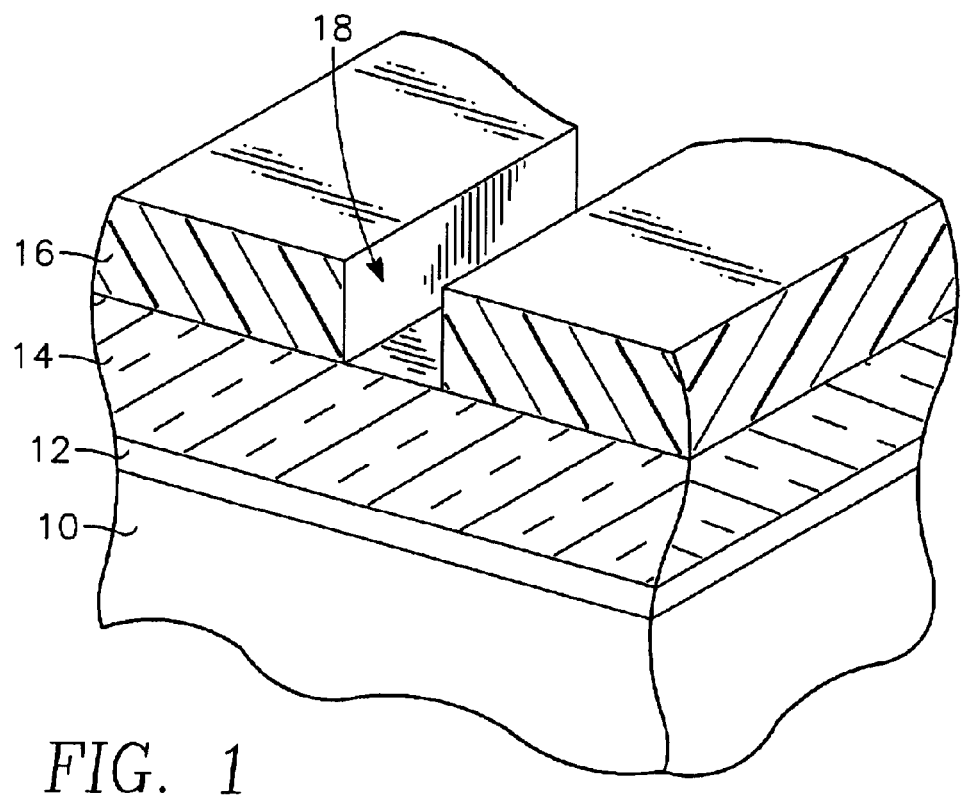
FIG. 1 is a sectioned isometric view of a vertical structure to be formed into a trench capacitor prior to etching.

We believe that a universal relationship may be stated linking the amount of fluorine, carbon, hydrogen, and oxygen in an etching mixture that produces an oxide etch not subject to etch stop and less prone to striations. This relationship is based on the understanding that fluorine is the etching species but hydrogen scavenges fluorine by forming HF. Carbon forms the protective polymer, and oxygen attacks the polymer to prevent etch stop. Excessively strong etching is likely to produce striations. Strong polymerization reduces striations, but excessive polymerization results in etch stop. Within the regime required for deep oxide hole etching without excessive striations, a universal parameter such as universal ratio R defined by R=(F—H)/(C—O) can be used to predict a useful regime. The variable F, H, C, and O are the atomic concentrations of fluorine, hydrogen, carbon, and oxygen atoms respectively in the etching gas mixture. However, since a ratio of these quantities is being used, the absolute flow, the pressure, and the residence time are not important, and Boyle's law may be used to relate molar concentrations of gases with standard volumetric flows. As a result, volumetric flows of the respective gases in arbitrary units may be used if the flows are multiplied by the number of respective atoms in the molecules of the flows. For example, 10 sccm of $CH_2F_2$ is calculated as 10 units of C, 20 units of H, and 20 units of F. If two constituent gases contain the same atomic species, the units resulting from the two gases are summed.

A number of oxide etching recipes were tested in the IPS oxide etch reactor, which is available from Applied Materials, Inc. of Santa Clara, Calif. The IPS reactor is a high-density plasma (HDP) reactor in which RF power is coupled by inductive coils over the roof of the reactor as the primary source of plasma power. A separate RF power supply connected to the pedestal electrode controls the DC self-bias on the wafer and hence the energy of ions accelerated across the plasma sheath toward the wafer. The IPS has a silicon chamber wall effective for both cleanliness and scavenging of fluorine if desired. The temperature of the silicon roof may be controlled. Additionally a silicon ring surrounds the wafer and is typically maintained hot as the primary control for scavenging fluorine from the etching plasma.

The gas flows of the various recipes are listed in TABLE 1 in units of sccm.

TABLE 1

| Recipe | $CF_4$ | $CHF_3$ | $CH_2F_2$ | $C_2F_6$ | $C_4F_6$ | $C_4F_8$ | Ar | CO |
|---|---|---|---|---|---|---|---|---|
| 1 | | | | | 19 | | 600 | |
| 2 | 13 | | | | 13 | | 600 | |
| 3 | 10 | | | | 16 | | 600 | |
| 4 | 12 | | | | 19 | | 600 | |
| 5 | | | | | | 16 | 600 | |
| 6 | | | 50 | | | 20 | 450 | |
| 7 | 20 | | | | | 7 | 300 | 10 |
| 8 | 40 | | | 10 | | 8 | 300 | |
| 9 | | | 50 | 15 | | | 300 | |
| 10 | | | 30 | 15 | | 8 | 600 | |

The chamber pressures were 25 milliTorr for recipes #1 through #5 and 60 milliTorr for the others. Other processing parameters for these recipes are silicon roof temperatures in range of 135 to 180° C., silicon ring temperatures of 270 to 300° C., pedestal temperatures of between −10 to +5° C., RF coil source power of between 1225 to 1570W except 2700W for #6, and RF bias power of between 850 to 1000W except 1400W for #6.

TABLE 2

| Recipe | $\frac{F-H}{C-O}$ | Striations | $d_{CD}$ (nm) | Etch Rate (nm/min) | $dS_{PR}$ |
|---|---|---|---|---|---|
| 1 | 1.50 | 1.0 | 35.2 | 382.5 | 4.5 |
| 2 | 2.00 | 1.5 | 11.4 | 457.5 | 3.5 |
| 3 | 1.84 | 0.0 | 19.9 | 461.3 | 4.0 |
| 4 | 1.84 | 1.0 | 22.3 | | |
| 5 | 2.00 | 1.5 | 15.8 | 567.7 | 4.1 |
| 6 | 2.00 | 3.0 | 32.3 | 1135 | 5.9 |
| 7 | 2.83 | 2.0 | 57 | 820 | 3.5 |
| 8 | 2.73 | 2.0 | 7.5 | 1000 | 3.8 |
| 9 | 2.38 | 3.0 | 39.0 | 950 | 5.0 |
| 10 | 2.33 | 2.0 | 62.5 | 925 | 4.2 |

Figure 2:
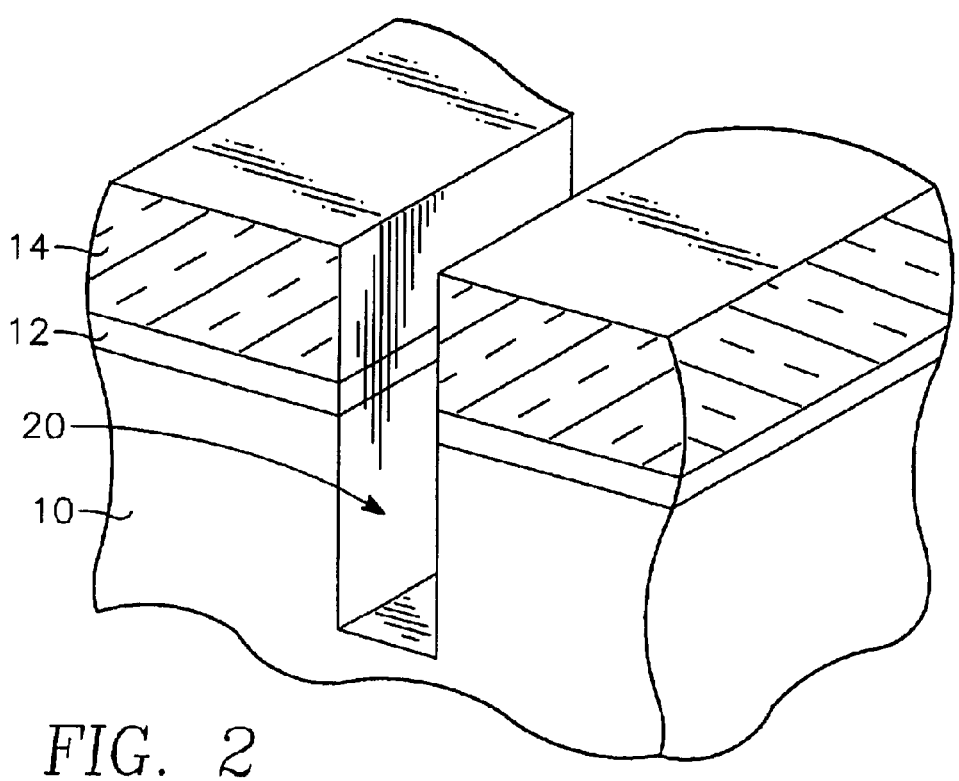
FIG. 2 is a sectioned isometric view of the structure of FIG. 1 after the etching process.

The values for striations were subjectively determined from viewing scanning electron micrographs (SEMs) on a scale where 0 is best and 5 is worst. Worsening striation behavior is exhibited by either an increasing number of striations or an increase in their size either laterally or longitudinally. The striation results are plotted in FIG. 2 as a function of the universal ratio R. It is seen that the best striation behavior, that is, a striation value of 2 or better (less), is obtained for R equal to and preferably less than 2. It is admitted that careful optimization for oxide etch recipes would in most cases allow acceptable striations for R>2. However, such careful optimization is generally inconsistent with a wide process recipe. That is, unless satisfactory striation behavior is not nearly immediately obtained in the evaluation tests, it is unlikely that a similar recipe can be found having a wide process window and producing few striations.

Octafluorocyclobutane ($C_4F_8$), for which R=2, is widely used as a sole etch gas in combination with argon. But such a recipe is generally felt to be excessively prone to striations. Accordingly, the value of R=2 should be avoided for a universal relationship.

Figure 3:
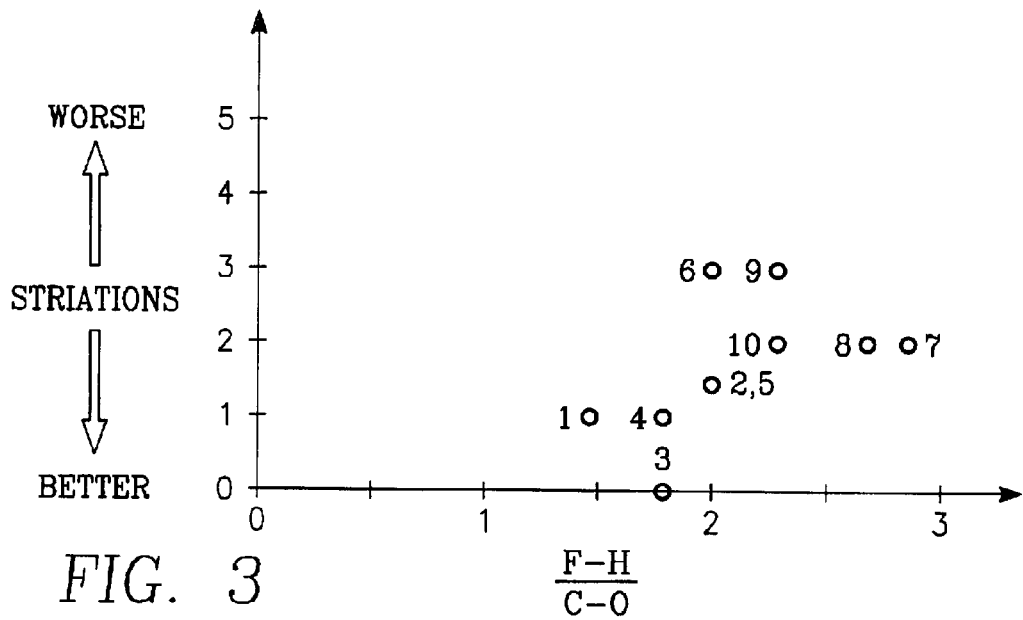
FIG. 3 is a graph illustrating the relative polymerizing and etching flows for a number of inventive and comparative oxide etch recipes.

The values for the loss of critical dimension $\Delta CD$ were determined from a measuring the difference between the hole width at the top of the hole and at the bottom after completion of oxide etching, where a positive value of $\Delta CD$ is a deleterious loss of CD. The CD results are plotted in FIG. 3 as a function of the universal ratio R. The results are not so clear cut, but the best values of $\Delta CD$ less than 20 nm are obtained for R equal to or less than 2.0 and the worst values are obtained for R greater than 2.0

No extensive tests were run to determine the occurrence of etch stop. However, based on experience with simpler chemistries, it is believed that a value for R of less than 1.5 increases the probability of etch stop.

Figure 4:
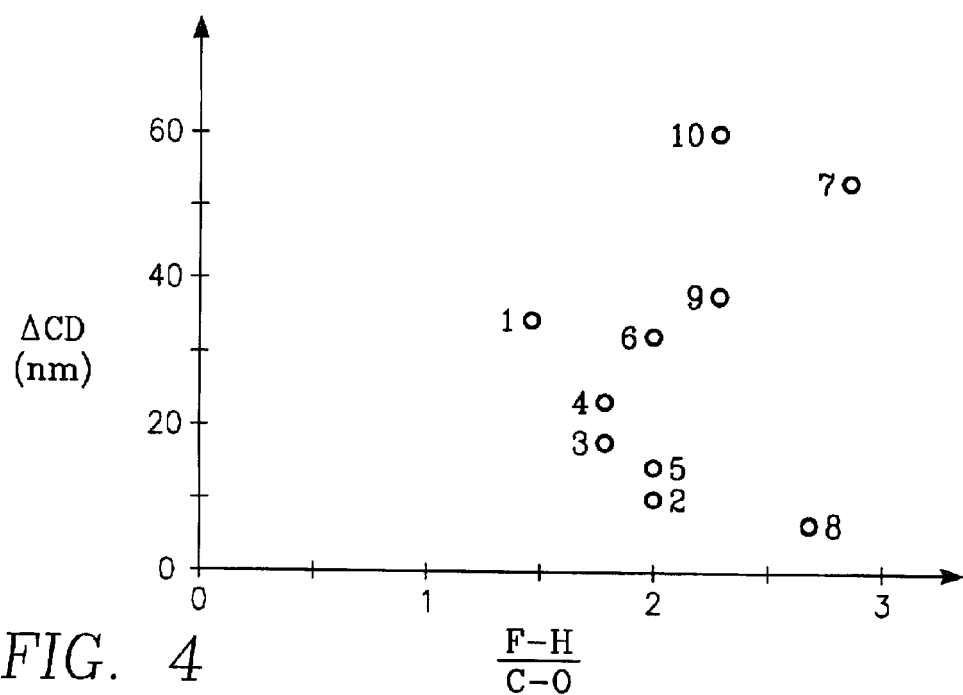
FIG. 4 is a graph illustrating the dependence the severity of striations upon a universal ratio of the invention.
Figure 5:
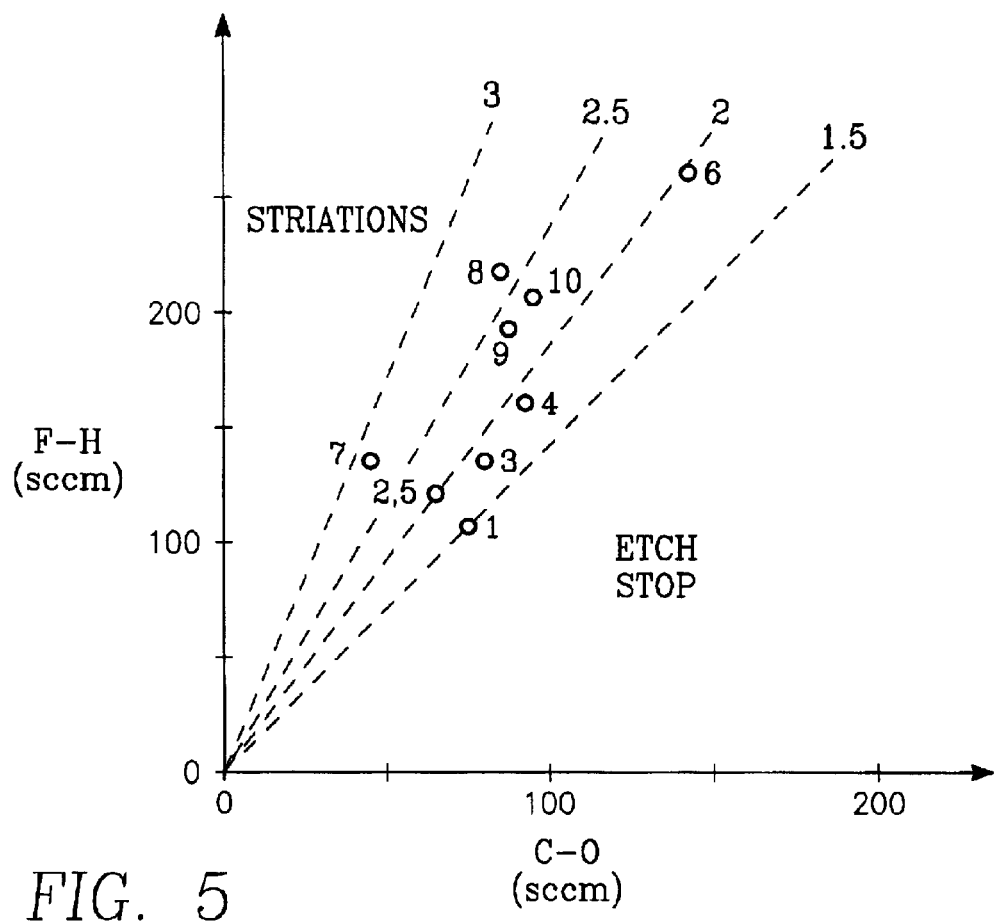
FIG. 5 is a graph illustrating the dependence of the loss of critical dimension upon the universal ratio.

The data points of TABLE 2 are also plotted on the graph of FIG. 4 showing the respective values of F—H and C—O for all the recipes. This plot shows proportionality lines 30, 32, 32, 34 for values of the universal ratio R respectively of 1.5, 2, 2.5, and 3. Generally, striations are excessive for R≧2, and etch stop is more likely to occur for R<1.5. Accordingly, a preferred band for oxide etching gas mixtures occurs for 1.5<R<2.

The above explanation is based mostly upon striation control. The deeper oxide etching and selectivity have not been as thoroughly included. Recent developments in etching deep holes in oxide having emphasized the hydrogen-free fluorocarbons having an F/C ratio of less than 2, such as $C_4F_6$ and octafluoropentadiene ($C_5F_8$). A great amount of control over the F/C ratio while still using these preferred main etching gases is to adjust a mixture of such fluorocarbons and carbon tetrafluoride ($CF_4$).

Although the above recipes have been developed for the IPS chamber, the invention can also be applied to more convention capacitively coupled reactors, such as the MxP reactor and its recent improvement the superE, available from Applied Materials. An example of an optimized recipe developed there is summarized in TABLE 3.

TABLE 3

| $C_4F_6$ Flow (sccm) | 30 |
|---|---|
| $O_2$ Flow (sccm) | 15 |
| CO Flow (sccm) | 120 |
| Ar Flow (sccm) | 140 |
| Bias Power (W) | 2300 |
| Magnetic Field (G) | 50 |
| Pressure (mTorr) | 30 |
| Cathode Temp. (° C.) | −20 |
| Time (s) | 240 |

In this recipe the universal ratio R is equal to 2.0.

Although the invention is particularly useful for a deep trench etch, it can also be applied to other oxide etch applications, particularly those requiring good selectivity to photoresist, reduced photoresist striations, and no etch stop.

The invention thus allows an oxide etching recipe to be quickly optimized by setting bounds on the compositional ranges that can be advantageously used.

What is claimed is:

1. A dielectric etch process, comprising the steps of:
   flowing into a plasma reaction chamber a etching gas mixture comprising $C_4F_6$, $O_2$, CO, and Ar; and
   exciting said etching gas mixture into a plasma to etch a dielectric layer.

2. The process of claim 1, wherein said $C_4F_6$ substantially comprises hexafluorobutadiene.

3. The process of claim 2, wherein said dielectric layer overlies a nitride layer which overlies a silicon layer and a mask having a trench shaped aperture overlies said dielectric layer and wherein said exciting step etches said dielectric layer selectively to said nitride layer.

4. The process of claim 3, wherein said silicon layer is a polysilicon layer.

5. The process of claim 3, further comprising the steps of:
   opening said nitride layer exposed by the etching of said dielectric layer; and
   etching a trench into said silicon layer.

6. The process of claim 2, wherein said flowing step flows a relative non-zero amounts of said $C_4F_6$, $O_2$, and CO such that a compositional ratio of F/(C—O) is at least 1.5 and no more than 2.0, wherein F, C, and O are respective atomic amounts of fluorine, carbon, and oxygen in said etching gas mixture.

7. The process of claim 2, wherein said compositional ratio is less than 2.0.

8. The process of claim 2, further comprising the steps of:
   applying RF power to a pedestal electrode supporting a substrate containing said dielectric layer; and
   separately applying electrical power as a primary source to excite said etching gas into said plasma.

9. The process of claim 8, wherein said separately applying step applies RF power to an inductive coil associated with said plasma reaction chamber.

10. The process of claim 2, wherein said exciting step includes applying RF power to a pedestal electrode supporting a substrate containing said dielectric layer, no other effective source of electrical power being applied to excite said plasma.

11. The process of claim 10, further comprising applying a magnetic field in said plasma reaction chamber.

12. A dielectric etching process, comprising the steps of:

flowing into a plasma reaction chamber a etching gas mixture comprising $C_4F_6$, $CF_4$, and Ar; and exciting said etching gas mixture into a plasma to etch a dielectric layer.

13. The process of claim 12, wherein said flowing step flows a relative non-zero amounts of said $C_4F_6$ and $CF_4$ such that a compositional ratio of F/C is at least 1.5 and no more than 2.0, wherein F and C, are respective atomic amounts of fluorine and carbon.

14. A method of plasma etching a dielectric layer, comprising the steps of:

flowing a gas mixture into a plasma reactor containing a substrate containing an oxide layer overlaid by a patterned photoresist layer, said gas mixture comprising a non-zero first amount of a first gas consisting of hexafluorobutadiene, a non-zero second amount of a second gas selected from the group of fluorocarbons and hydrofluorocarbons other than hydrogen-free fluorocarbons having F/C ratios of less than two, a third amount of a third gas selected from the group of oxygen-containing compounds consisting of oxygen and carbon monoxide, and a non-zero fourth amount of a noble diluent gas, said first, second, and third amounts being chosen so that a compositional ratio of (F—H)/(C—O) is at least 1.5 and no more than 2.0, wherein F, H, C, and O are respective atomic amounts of fluorine, hydrogen, carbon, and oxygen in said first, second, and third amounts of said first, second, and third gases respectively; and exciting said gas mixture into a plasma to etch said dielectric layer.

15. The method of claim 14, wherein said compositional ratio is less than 2.0.

16. The method of claim 14, wherein said second gas has an F/C ratio of greater than 2.0.

17. The method of claim 16, wherein said second gas is a hydrogen-free fluorocarbon.

18. The method of claim 17, wherein said second gas comprises $CF_4$.

19. The method of claim 17, wherein said third amount is a non-zero amount and said oxygen-containing compound is CO.

20. The method of claim 17, wherein said third amount is a non-zero amount and said oxygen-containing compound is $O_2$.

21. The method of claim 14, wherein said third amount is a non-zero amount and said oxygen-containing compound is CO.

22. The method of claim 14, wherein said third amount is a non-zero amount and said oxygen-containing compound is $O_2$.

* * * * *